(12) United States Patent
Sakamoto et al.

(10) Patent No.: US 11,646,392 B2
(45) Date of Patent: May 9, 2023

(54) METHOD OF MANUFACTURING LIGHT-EMITTING DEVICE

(71) Applicant: NICHIA CORPORATION, Anan (JP)

(72) Inventors: Keiji Sakamoto, Tokushima (JP); Takashi Abe, Anan (JP); Hitoshi Minakuchi, Anan (JP); Tsuyoshi Ito, Anan (JP); Katsuyuki Kawabata, Anan (JP); Kenji Hashizume, Anan (JP)

(73) Assignee: NICHIA CORPORATION, Anan (JP)

( * ) Notice: Subject to any disclaimer, the term of this patent is extended or adjusted under 35 U.S.C. 154(b) by 25 days.

(21) Appl. No.: 17/342,233

(22) Filed: Jun. 8, 2021

(65) Prior Publication Data

US 2021/0384375 A1  Dec. 9, 2021

(30) Foreign Application Priority Data

Jun. 9, 2020 (JP) .............................. JP2020-100295
Jan. 18, 2021 (JP) .............................. JP2021-005983

(51) Int. Cl.
*H01L 33/00* (2010.01)
*H01L 33/50* (2010.01)

(52) U.S. Cl.
CPC ........ *H01L 33/0093* (2020.05); *H01L 33/505* (2013.01); *H01L 2933/0041* (2013.01)

(58) Field of Classification Search
CPC ............... H01L 33/0093; H01L 33/505; H01L 2933/0041; H01L 33/0095; H01L 33/50; H01L 21/78
USPC .......................................................... 438/29
See application file for complete search history.

(56) References Cited

U.S. PATENT DOCUMENTS

| 2010/0148198 | A1 | 6/2010 | Sugizaki et al. |
| 2010/0252845 | A1* | 10/2010 | Lin ....................... H01L 33/508 257/E33.056 |
| 2011/0073889 | A1 | 3/2011 | Sugizaki et al. |
| 2011/0073890 | A1* | 3/2011 | Sugizaki ................. H01L 33/62 257/E33.061 |
| 2011/0297994 | A1* | 12/2011 | Sugizaki ............. H01L 25/0753 257/E33.058 |

(Continued)

FOREIGN PATENT DOCUMENTS

| JP | 2010-141176 A | 6/2010 |
| JP | 2011-071272 A | 4/2011 |

(Continued)

*Primary Examiner* — Bo B Jang
(74) *Attorney, Agent, or Firm* — Foley & Lardner LLP

(57) ABSTRACT

A method of manufacturing a light-emitting device includes: providing a substrate having a first surface and a second surface opposite to the first surface; forming, on or above the first surface of the substrate, a semiconductor structure comprising a light-emitting layer; forming a crack inside the substrate, the crack reaching the first surface of the substrate; disposing a wavelength conversion layer on the second surface of the substrate; forming a first recess in the wavelength conversion layer by removing a first portion of the wavelength conversion layer, the first portion overlapping with the crack when viewed in a direction from the wavelength conversion layer toward the semiconductor structure, and leaving a second portion of the wavelength conversion layer between the first recess and the semiconductor structure; and cleaving the second portion along the crack.

20 Claims, 14 Drawing Sheets

(56) References Cited

U.S. PATENT DOCUMENTS

| | | | |
|---|---|---|---|
| 2015/0048398 A1 | 2/2015 | Ichikawa et al. | |
| 2016/0163916 A1 | 6/2016 | Iiievski et al. | |
| 2017/0278834 A1* | 9/2017 | Tanaka | H01L 33/44 |
| 2018/0198037 A1 | 7/2018 | Leirer et al. | |
| 2019/0030648 A1 | 1/2019 | Priewasser et al. | |

FOREIGN PATENT DOCUMENTS

| | | |
|---|---|---|
| JP | 2011-243875 A | 12/2011 |
| JP | 2015-029079 A | 2/2015 |
| JP | 2018-517305 A | 6/2018 |
| JP | 2018-123253 A | 8/2018 |
| JP | 2019-033280 A | 2/2019 |
| JP | 2019-050357 A | 3/2019 |
| WO | WO-2016/198620 A1 | 12/2016 |

* cited by examiner

METHOD OF MANUFACTURING LIGHT-EMITTING DEVICE

CROSS-REFERENCE TO RELATED APPLICATIONS

This application claims priority to Japanese Patent Application No. 2020-100295, filed on Jun. 9, 2020, and Japanese Patent Application No. 2021-005983, filed on Jan. 18, 2021, the disclosures of which are hereby incorporated by reference in their entireties.

BACKGROUND

Embodiments of the present disclosure relate to a method of manufacturing a light-emitting device.

PCT publication No. WO 2016/198620 discloses a method of singulating a light-emitting device by sawing, the light-emitting device including a growth substrate made of single crystal sapphire, a semiconductor layered body formed on the growth substrate, and a wavelength conversion layer. The growth substrate may be chipped in such singulation, and there is a demand for improvement in yield.

SUMMARY

One object of certain embodiments of the present disclosure is to provide a method of manufacturing a light-emitting device that can improve yield.

According to one embodiment, a method of manufacturing a light-emitting device includes: providing a substrate having a first surface and a second surface opposite to the first surface; forming a semiconductor structure including a light-emitting layer on or above the first surface of the substrate; forming a crack inside the substrate, the crack reaching the first surface of the substrate; disposing a wavelength conversion layer on the second surface of the substrate; forming a first recess in the wavelength conversion layer by removing a first portion of the wavelength conversion layer, the first portion overlapping with the crack when viewed in a direction from the wavelength conversion layer toward the semiconductor structure, and leaving a second portion of the wavelength conversion layer between the first recess and the semiconductor structure; and cleaving the second portion along the crack.

According to another embodiment, a method of manufacturing a light-emitting device includes: providing a substrate having a first surface and a second surface opposite to the first surface; forming a semiconductor structure including a light-emitting layer on or above the first surface of the substrate; forming a crack inside the substrate, the crack reaching the first surface of the substrate; forming a third surface of the substrate by removing a portion of the substrate from a second surface after the step of forming the crack; disposing a wavelength conversion layer on or above the third surface of the substrate; forming a first recess in the wavelength conversion layer by removing a first portion of the wavelength conversion layer, the first portion overlapping with the crack when viewed in a direction from the wavelength conversion layer toward the semiconductor structure, and leaving a second portion of the wavelength conversion layer between the first recess and the semiconductor structure; and cleaving the second portion along the crack.

Certain embodiments of the present disclosure can provide a method of manufacturing a light-emitting device that can improve yield.

DETAILED DESCRIPTION

First Embodiment

A method of manufacturing a light-emitting device 100 according to a first embodiment will be described below.

Figure 1:
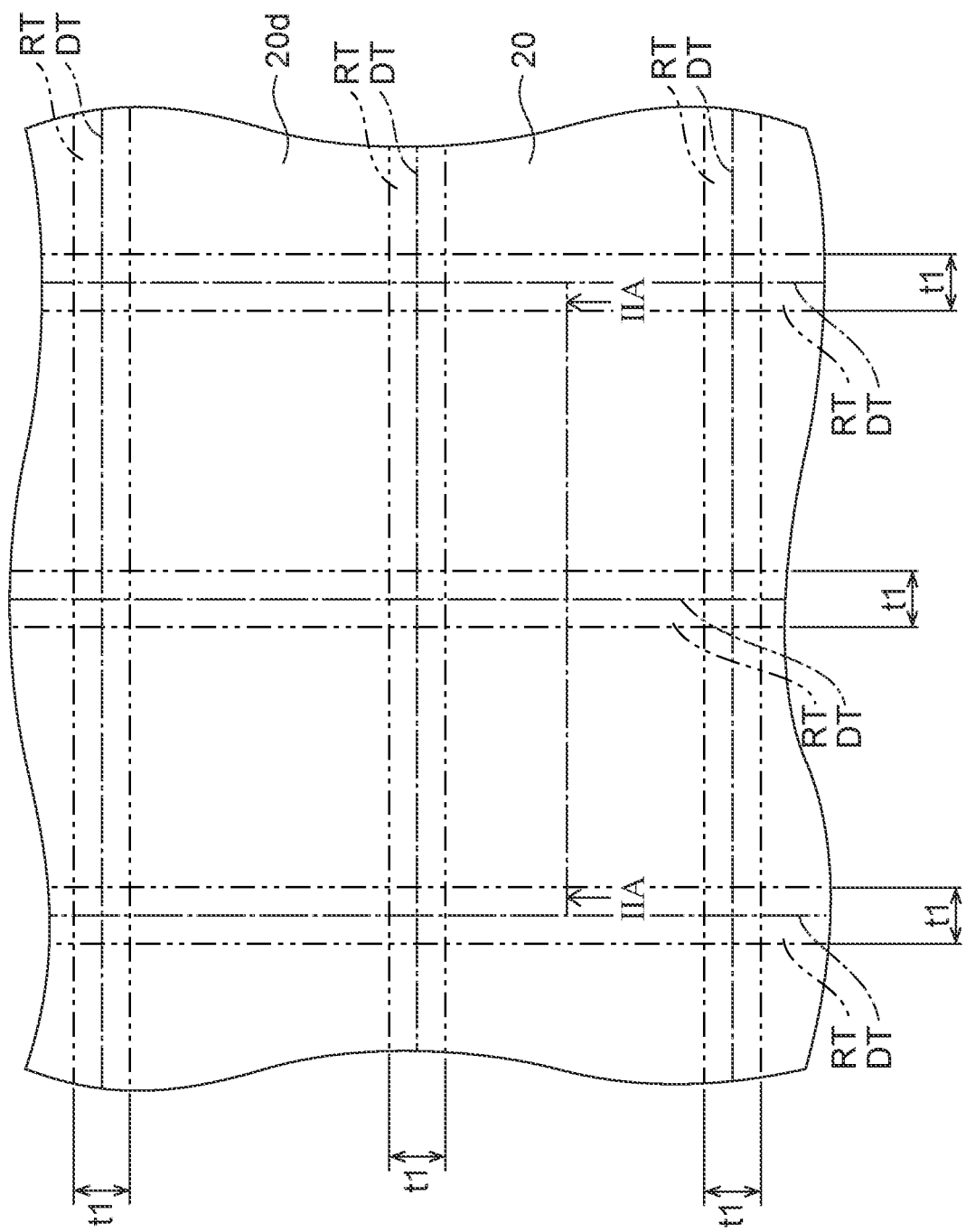
FIG. 1 is a schematic plan view illustrating a method of manufacturing a light-emitting device according to a first embodiment.

FIG. 1 is a schematic plan view illustrating the method of manufacturing a light-emitting device according to the present embodiment. FIG. 1 shows positions of cutting and cleaving, in which a wavelength conversion layer 30 disposed on an upper surface of a substrate 20 is not shown.

FIG. 2A to FIG. 4B are schematic cross-sectional views illustrating the method of manufacturing a light-emitting device according to the present embodiment.

FIG. 2A to FIG. 4B are schematic cross-sectional views taken along the line IIA-IIA of FIG. 1.

Providing Substrate 20

Figure 2A:
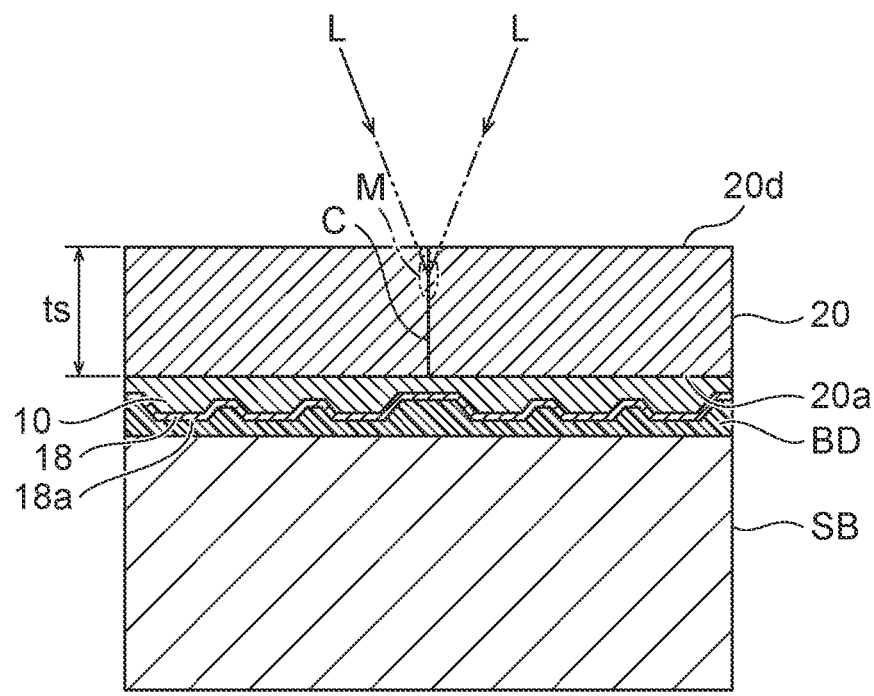
FIG. 2A is a schematic cross-sectional view illustrating the method of manufacturing a light-emitting device according to the first embodiment.

First, the substrate 20 is provided. As shown in FIG. 1, the substrate 20 is a wafer and is singulated into a plurality of substrates 20A of light-emitting devices 100 in a subsequent step. The substrate 20 has a first surface 20a and a second surface 20d opposite to the first surface 20a as shown in FIG. 2A. In FIG. 2A, the first surface 20a and the second surface 20d are the lower surface and the upper surface of the substrate 20, respectively. A thickness is of the substrate 20 is, for example, 500 µm or more and 1,000 µm or less. The substrate 20 is made of, for example, single crystal sapphire. The substrate 20 may be a substrate made of gallium nitride.

Forming Semiconductor Structure 10

Subsequently, a semiconductor structure 10 is formed on the first surface 20a of the substrate 20.

In the present specification, the term "upper/above" refers to a direction from the semiconductor structure 10 toward the substrate 20, and the term "lower/below" refers to a direction opposite to the "upper/above" direction. However, such expression is used for convenience and has no relation to the direction of gravity.

Figure 6A:
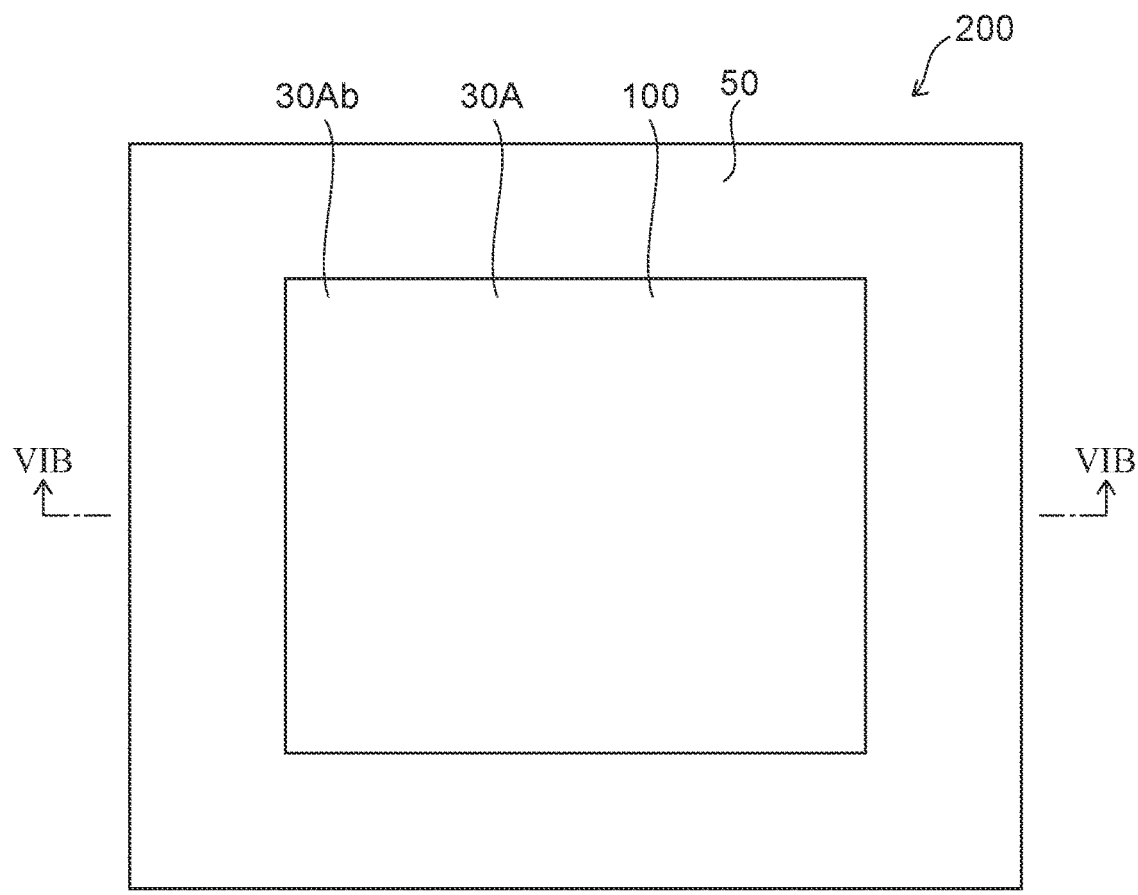
FIG. 6A is a schematic plan view of a light-emitting module in the first embodiment.
Figure 6B:
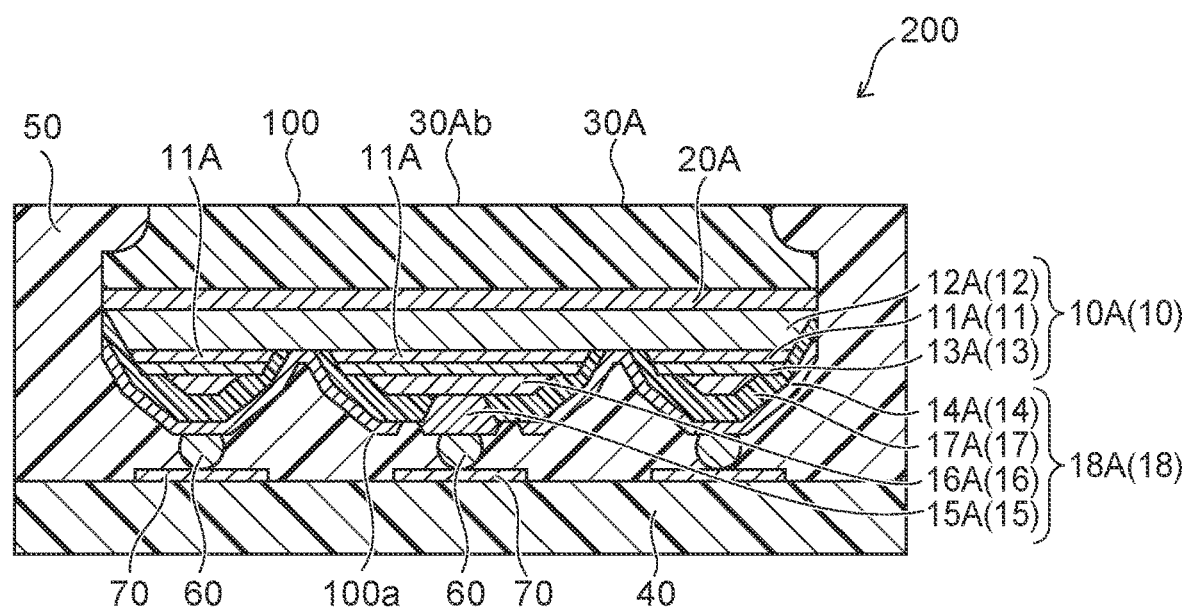
FIG. 6B is a schematic cross-sectional view of the light-emitting module in the first embodiment.

The semiconductor structure 10 includes a light-emitting layer 11, an n-side semiconductor layer 12, and a p-side semiconductor layer 13 as shown in FIG. 6B. For example, the light-emitting layer 11, the n-side semiconductor layer 12, and the p-side semiconductor layer 13 are made of a nitride semiconductor. Examples of the nitride semiconductor include semiconductors having compositions with varying composition ratios x and y in the chemical formula represented by $In_xAl_yGa_{1-x-y}N$ (where $0 \leq x \leq 1$, $0 \leq y \leq 1$, and $x+y \leq 1$). The semiconductor structure 10 is formed by epitaxial growth using the substrate 20.

Subsequently, a wiring structure 18 is formed below the semiconductor structure 10.

A portion on the lower surface side of the semiconductor structure 10 is first removed. Subsequently, the wiring structure 18 is formed below the semiconductor structure 10. The wiring structure 18 includes a first electrically conductive layer 14, a second electrically conductive layer 15, a p-side electrode 16, and an insulating layer 17. The p-side electrode 16 is disposed on the p-side semiconductor layer 13. The first electrically conductive layer 14 is connected to the n-side semiconductor layer 12, and the second electrically conductive layer 15 is connected to the p-side semiconductor layer 13 via the p-side electrode 16. The insulating layer 17 is disposed on the surface of the semiconductor structure 10 and the surface of the p-side electrode 16. A portion of the insulating layer 17 is disposed between the first electrically conductive layer 14 and the p-side electrode 16.

Bonding Supporting Substrate SB

After the semiconductor structure 10 is formed, a supporting substrate SB is bonded. The supporting substrate SB is bonded to the side opposite to the substrate 20 side of the semiconductor structure 10 as shown in FIG. 2A. Specifically, the supporting substrate SB is bonded to a lower surface 18a of the wiring structure 18. The supporting substrate SB is, for example, a sapphire substrate. Bonding of the supporting substrate SB is performed using, for example, a bonding member BD containing polyimide and the like.

Forming Crack C in Substrate 20

Subsequently, a crack C is formed in the substrate 20. The crack C is formed by irradiating the substrate 20 with a laser beam L as shown in FIG. 2A. The laser beam L is applied continuously or at regular intervals along a plurality of intended singulation lines DT shown in FIG. 1 in a plan view. The intended singulation lines DT are imaginary lines set in order to cleave the substrate 20 and perform singulation into a plurality of light-emitting devices 100. The laser beam L is applied along the intended singulation lines DT lying along two intersecting directions as shown in FIG. 1.

The laser beam L is applied to the substrate 20 from the second surface 20d of the substrate 20 as shown in FIG. 2A. The laser beam L is condensed inside the substrate 20 while scanning is performed along the intended singulation lines DT, so that modified regions M are formed inside the substrate 20. A plurality of modified regions M are therefore formed inside the substrate 20 along the intended singulation lines DT. In order to reduce the influence of heat on the semiconductor structure 10, the laser beam L is preferably condensed at a position half or more of the thickness is of the substrate 20 away from the first surface 20a. The laser beam L is preferably condensed at, for example, a position 30 µm or more and 100 µm or less away from the first surface 20a.

For example, a pulsed laser or a continuous wave laser that can cause multiphoton absorption can be used to provide the laser beam L. The pulse width of the laser beam L is, for example, in a range of 100 fsec to 800 psec. The peak wavelength of the laser beam L is, for example, a peak wavelength that can be transmitted through the substrate 20. The peak wavelength of the laser beam L is, for example, in a range of 350 nm or more and 1,100 nm or less. The spot size of the laser beam L is, for example, in a range of 1 µm or more and 10 µm or less.

The modified regions M are formed in regions away from the first surface 20a of the substrate 20. The cracks C develop from the modified regions M to the first surface 20a and reach the first surface 20a of the substrate 20. The cracks C may also develop from the modified regions M toward the second surface 20d and reach the second surface 20d of the substrate 20. By forming the modified regions M on the second surface 20d side in the thickness direction of the substrate 20, the cracks C can be formed in predetermined portions of the substrate 20, while damage to the semiconductor structure 10 by the laser beam L is reduced. Further, the cracks C are formed in the substrate 20 in a state in which the supporting substrate SB is bonded. This allows for reducing chipping of the substrate 20 due to formation of the cracks C.

The cracks C are formed inside the substrate 20 using the laser beam L in the present embodiment, but this method is not limiting. The cracks C may be formed by producing internal stress in the substrate 20 by another method. For example, by applying external force to the substrate 20, the cracks C may be formed inside the substrate 20.

Forming Third Surface 20b on Substrate 20

Figure 2B:
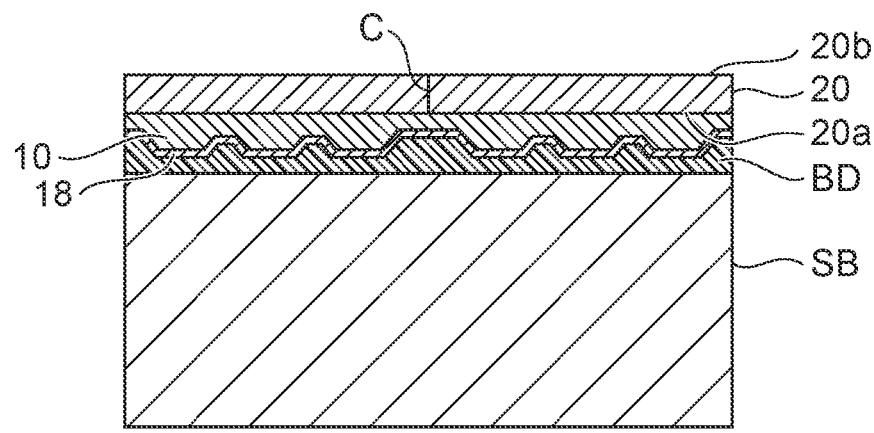
FIG. 2B is a schematic cross-sectional view illustrating the method of manufacturing a light-emitting device according to the first embodiment.

A third surface 20b is formed on the substrate 20 as shown in FIG. 2B. The third surface 20b is formed by removing a portion of the substrate 20 from the second surface 20d. The third surface 20b thus replaces the second surface 20d, which has been the upper surface of the substrate 20 before processing, to serve as the upper surface. The thickness of the substrate 20 becomes, for example, 10 μm or more and 50 μm or less due to formation of the third surface 20b. With the substrate 20 having the reduced thickness, light emitted from a lateral surface 20Ac of the substrate 20A can be reduced and light propagating toward the wavelength conversion layer 30 can be increased in the light-emitting device 100 described below, so that the light extraction efficiency can be enhanced. When a portion of the substrate 20 is removed, the modified regions M are removed from the substrate 20, and the cracks C remain in the substrate 20. For example, by removing a portion of the substrate 20 from the second surface 20d side in the thickness direction of the substrate 20, the substrate 20 has the reduced thickness and also modified regions M are removed. Accordingly, cleaving can be performed more easily in a step of cleaving the wavelength conversion layer 30 described below than in the case in which the modified regions M stay in the substrate 20. By removing the substrate 20 in a state in which the supporting substrate SB is bonded to the semiconductor structure 10, a warp of the substrate 20 having the reduced thickness can be reduced. The substrate 20 is removed by, for example, grinding or polishing. The substrate 20 can be polished by, for example, chemical mechanical polishing (CMP).

The modified regions M may remain in the substrate 20 after the step of forming the third surface 20b on the substrate 20. The step of forming the third surface 20b on the substrate 20 may not be performed. The modified regions M remain in the substrate 20 also in this case.

Disposing Wavelength Conversion Layer 30

Subsequently, the wavelength conversion layer 30 is disposed on the surface where the second surface 20d of the substrate 20 has been removed.

Figure 3A:
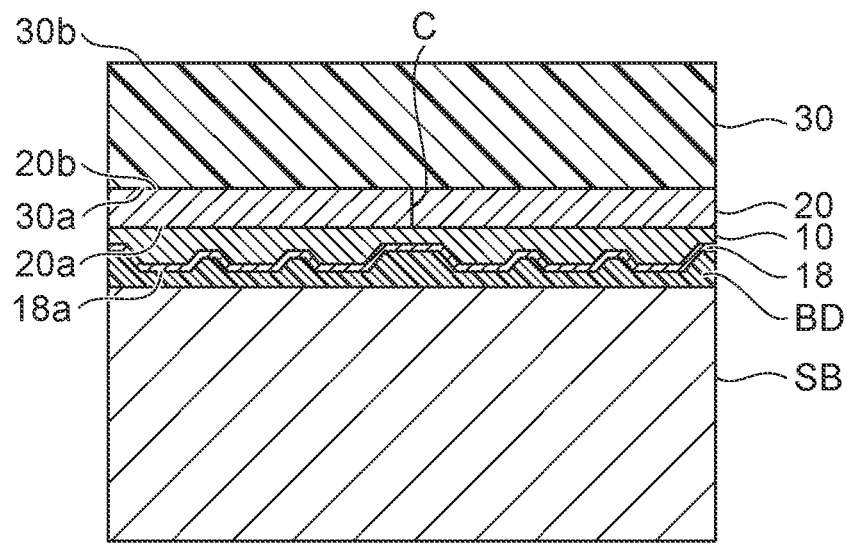
FIG. 3A is a schematic cross-sectional view illustrating the method of manufacturing a light-emitting device according to the first embodiment.

In the present embodiment, the wavelength conversion layer 30 is disposed on the third surface 20b of the substrate 20 as shown in FIG. 3A. A lower surface 30a of the wavelength conversion layer 30 is bonded to the third surface 20b of the substrate 20. The lower surface 30a of the wavelength conversion layer 30 is bonded to the third surface 20b of the substrate 20 by, for example, surface-activated bonding. The thickness of the wavelength conversion layer 30 is greater than the thickness of the substrate 20 having the reduced thickness. The thickness of the wavelength conversion layer 30 can be, for example, 100 μm or more and 300 μm or less. The wavelength conversion layer 30 can contain a phosphor. For the wavelength conversion layer 30, for example, a sintered body of a phosphor or a mixture of resin or glass and a phosphor is used. For the phosphor, for example, a cerium-activated yttrium-aluminum-garnet phosphor (YAG:Ce) can be used.

Removing Supporting Substrate SB

After the wavelength conversion layer 30 is disposed, the supporting substrate SB is removed. A tape material T is applied to the lower surface 18a of the wiring structure 18. By disposing the tape material T, cleaving can be easily performed in the cleaving step described below.

Forming First Recess R1 and Leaving Second Portion P2

Figure 3B:
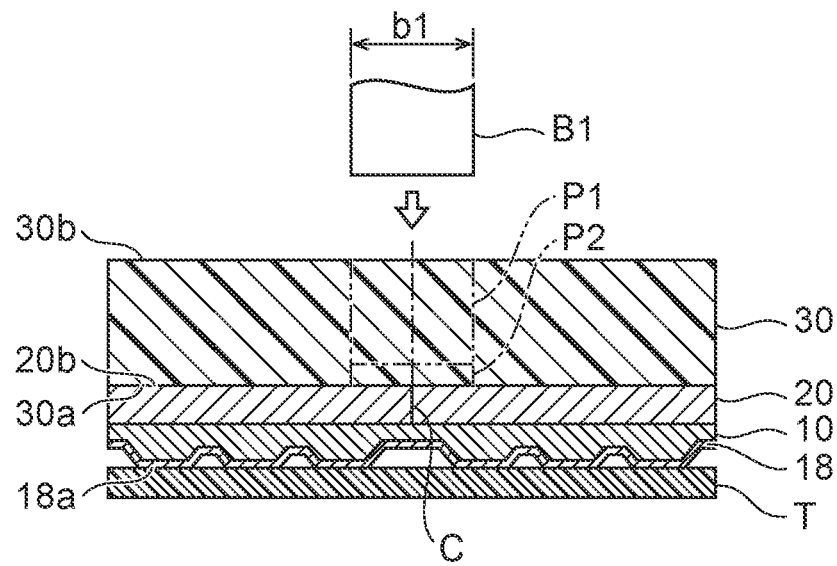
FIG. 3B is a schematic cross-sectional view illustrating the method of manufacturing a light-emitting device according to the first embodiment.
Figure 4A:
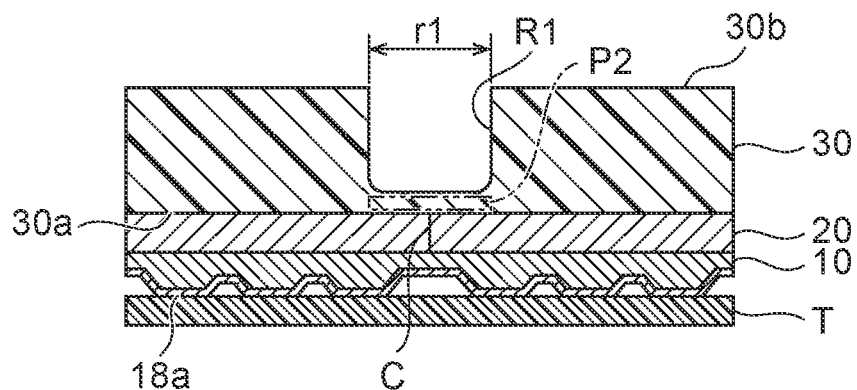
FIG. 4A is a schematic cross-sectional view illustrating the method of manufacturing a light-emitting device according to the first embodiment.

A first portion P1 of the wavelength conversion layer 30 is removed as shown in FIG. 3B and FIG. 4A. A first recess R1 is thus formed in the wavelength conversion layer 30, and a second portion P2 is left. The first portion P1 overlaps with the crack C when viewed in a direction from the wavelength conversion layer 30 toward the semiconductor structure 10. An imaginary line that continues from the crack C is located substantially at the center of the first portion P1 in a cross-sectional view as shown in FIG. 3B. The first portion P1 is a portion of the wavelength conversion layer 30 away from the substrate 20. The second portion P2 is located between the first recess R1 and the semiconductor structure 10. The second portion P2 is located directly below and adjacent to the first portion P1. The thickness of the second portion P2 is, for example, smaller than the thickness of the first portion P1. The second portion P2 is located directly above the crack C in a cross-sectional view. The imaginary line that continues from the crack C is located substantially at the center of the second portion P2.

By removing the first portion P1 in a processing region RT shown in FIG. 1 in a plan view, the first recess R1 is formed, and the second portion P2 is left. The processing region RT is a region in which the wavelength conversion layer 30 is removed. The processing region RT is a region including the intended singulation line DT in a plan view, and the first portion P1 is removed along the intended singulation line DT.

The first portion P1 is removed by, for example, cutting with a blade B1. A width b1 of the blade B1 is, for example, 30 μm or more and 300 μm or less. A width r1 of the first recess R1 formed by removal of the first portion P1 is, for example, 30 μm or more and 300 μm or less. The width r1 of the first recess R1 formed by removal of the first portion P1 may be slightly greater than the width b1 of the blade B1. The thickness of the wavelength conversion layer 30 removed when the first recess R1 is formed is preferably, for example, 50% or more and 90% or less, more preferably 70% or more and 90% or less, of the thickness of the wavelength conversion layer 30. In order to leave the second portion P2 between the first portion P1 and the substrate 20, cutting with the blade B1 is performed such that the blade B1 does not reach the substrate 20. The substrate 20 is not cut when the first portion P1 of the wavelength conversion layer 30 is cut with the blade B1 as described above, so that chipping of the substrate 20 is reduced. This allows the light-emitting device 100 described below to have lateral surfaces 100c in a desired shape, so that yield can be improved. For example, in the case in which the wavelength conversion layer 30 and the substrate 20 are cut with the blade B1, the substrate 20 may be chipped. It is therefore difficult to form the lateral surfaces 100c of the light-emitting device 100 into a desired shape, which may cause reduction in yield. The first portion P1 of the wavelength conversion layer 30 is removed using the blade B1, and the second portion P2 is left. The area of an upper surface 30Ab of a wavelength conversion layer 30A therefore becomes smaller than the area of a lower surface 30Aa in the light-emitting device 100 to be obtained after cleaving described below, so that the luminance of the light-emitting device 100 is enhanced. The area of an upper surface 30b of the wavelength conversion layer 30 can be adjusted by appropriately changing the width b1 of the blade B1.

A portion of the wavelength conversion layer 30 is removed using the blade B1 in the present embodiment, but this operation is not limiting. Removal may be performed by means other than a blade. For example, the portion of the wavelength conversion layer 30 may be removed by irradiation with a laser beam.

Cleaving

Subsequently, the second portion P2 of the wavelength conversion layer 30 is cleaved along the crack C.

Figure 4B:
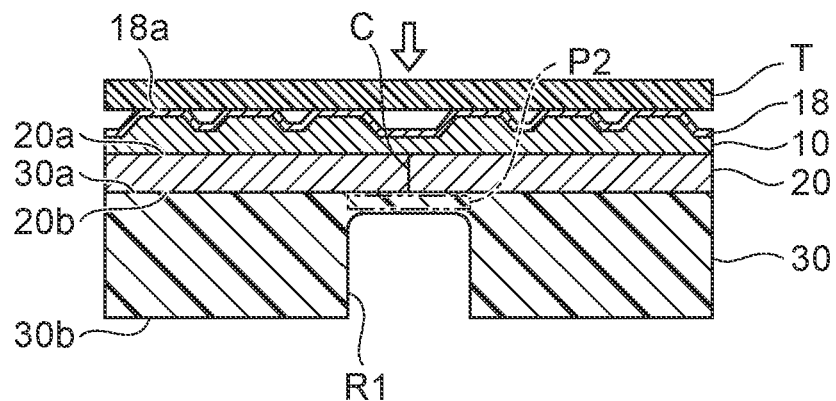
FIG. 4B is a schematic cross-sectional view illustrating the method of manufacturing a light-emitting device according to the first embodiment.

As shown in FIG. 4B, for example, a portion of the substrate 20 located directly below the first recess R1 is pressed from the tape material T side. The substrate 20 is thus cleaved using the crack C, and the second portion P2 of the wavelength conversion layer 30 is cleaved, so that singulation into a plurality of light-emitting devices 100 each including the semiconductor structure 10, the wiring structure 18, the substrate 20, and the wavelength conversion layer 30 is achieved. The second portion P2 is cleaved along the crack C formed along the intended singulation line DT. The semiconductor structure 10 and the wiring structure 18 are also cleaved along the crack C in this cleaving step. By forming the crack C inside the substrate 20 before the wavelength conversion layer 30 is disposed on the substrate 20, the second portion P2 and the substrate 20 can be easily cleaved, so that yield in the cleaving step can be improved. Further, the crack C reaches the first surface 20a of the substrate 20 before the cleaving step, and the crack C is inhibited from developing in an unintended direction at the time of cleaving, so that chipping of the substrate 20 can be reduced.

A plurality of light-emitting devices 100 are manufactured through the above steps. Each light-emitting device 100 includes a semiconductor structure 10A that is a portion of the semiconductor structure 10, a wiring structure 18A that is a portion of the wiring structure 18, the substrate 20A that is a portion of the substrate 20, and the wavelength conversion layer 30A that is a portion of the wavelength conversion layer 30. As shown in FIG. 5B, the lateral surfaces 100c of the light-emitting device 100 each include a mark of the crack C in the substrate 20, an inner surface of the first recess R1 and a cleaved surface of the second portion P2 in the wavelength conversion layer 30, cleaved surfaces of the semiconductor structure 10 and the wiring structure 18, and a cleaved surface of the substrate 20.

The light-emitting device 100 manufactured by the manufacturing method according to the present embodiment will be described below.

Figure 5A:
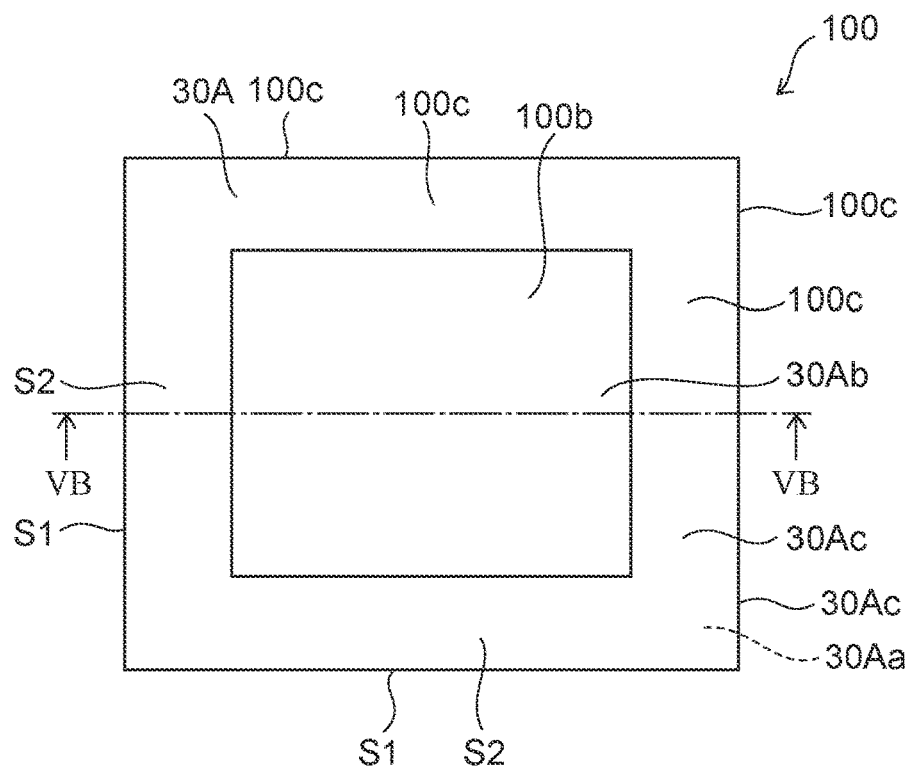
FIG. 5A is a schematic plan view of the light-emitting device in the first embodiment.
Figure 5B:
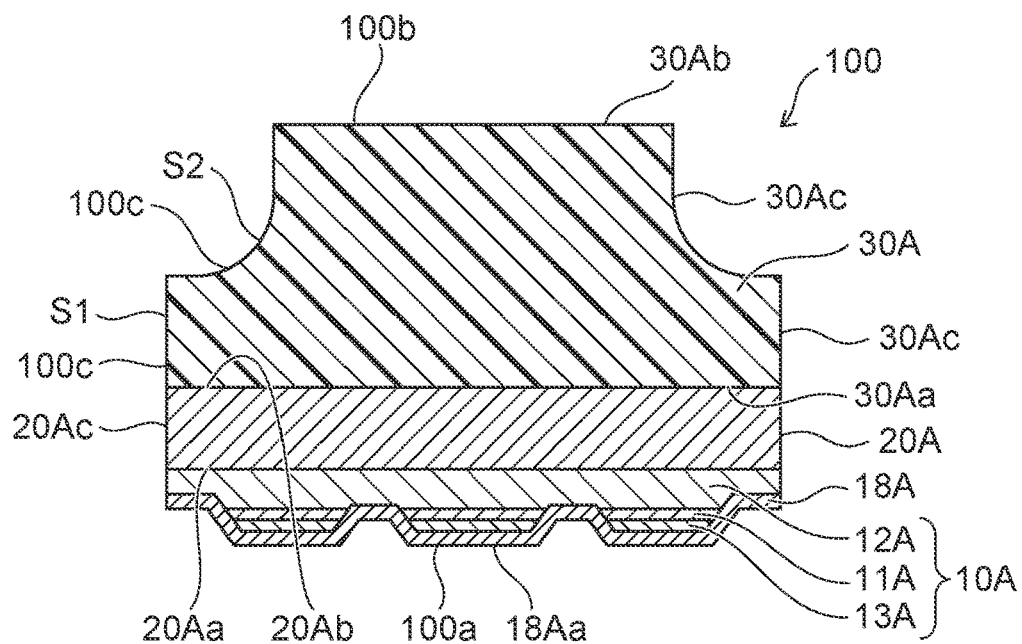
FIG. 5B is a schematic cross-sectional view of the light-emitting device in the first embodiment.

FIG. 5A is a schematic plan view of the light-emitting device in the present embodiment.

FIG. 5B is a schematic cross-sectional view of the light-emitting device in the present embodiment.

As shown in FIG. 5B, the light-emitting device 100 includes the semiconductor structure 10A, the wiring structure 18A, the substrate 20A, and the wavelength conversion layer 30A. The substrate 20A is located on the semiconductor structure 10A. The substrate 20A is, for example, single crystal sapphire. The substrate 20A has a first surface 20Aa, a third surface 20Ab opposite to the first surface 20Aa, and the lateral surface 20Ac located between the first surface 20Aa and the third surface 20Ab. The thickness of the substrate 20A is, for example, in a range of 10 μm or more and 50 μm or less. The lateral surface 20Ac may include a portion of the modified region M. In this case, the modified region M may be formed in a region away from the first surface 20Aa, which is the lower surface, of the substrate 20A.

The wavelength conversion layer 30A is located on the substrate 20A. The surfaces of the wavelength conversion layer 30A include the lower surface 30Aa, the upper surface 30Ab opposite to the lower surface 30Aa, and four lateral surfaces 30Ac located between the lower surface 30Aa and the upper surface 30Ab. As shown in FIG. 5A, the area of the upper surface 30Ab of the wavelength conversion layer 30A is smaller than the area of the lower surface 30Aa of the wavelength conversion layer 30A in a top view. The thickness of the wavelength conversion layer 30A is, for example, greater than the thickness of the substrate 20A. The thickness of the wavelength conversion layer 30A is, for example, 100 μm or more and 300 μm or less.

Figure 5C:
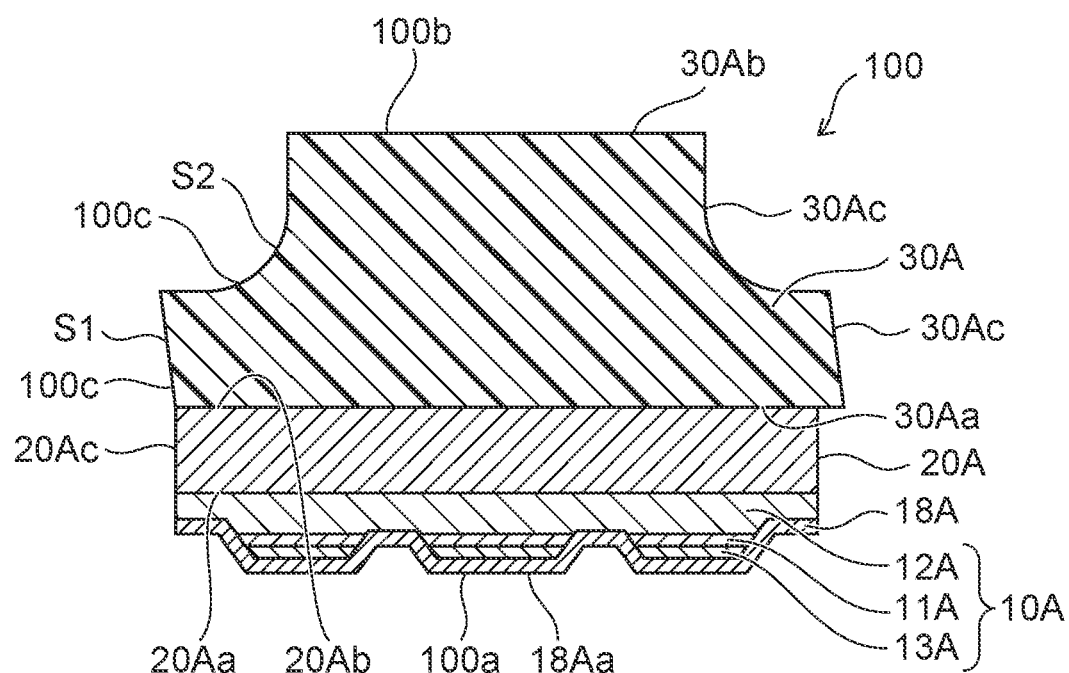
FIG. 5C is a schematic cross-sectional view of the light-emitting device in the first embodiment.

The lateral surfaces 30Ac of the wavelength conversion layer 30A each include a first surface S1 and a second surface S2. The first surface S1 is located on the lower surface 30Aa side and adjacent to the lateral surface 20Ac of the substrate 20A. The first surface S1 is a cleaved surface formed by cleaving. The first surface S1 and the lateral surface 20Ac of the substrate 20A are in substantially the same plane. The second surface S2 is located closer to the upper surface 30Ab than the first surface S1 is and connects the upper surface 30Ab and the first surface S1. The second surface S2 is a cut surface formed by cutting with the blade B1. The second surface S2 includes a curved surface. As shown in FIG. 5C, the first surface S1 and the lateral surface 20Ac of the substrate 20A are not in the same plane. The first surface S1 is located outside the lateral surface 20Ac of the substrate 20A. The first surface S1 may have an inclined surface that is inclined with respect to the lateral surface 20Ac of the substrate 20A.

The surfaces of the light-emitting device 100 include a lower surface 100a, an upper surface 100b opposite to the lower surface 100a, and four lateral surfaces 100c connecting the lower surface 100a and the upper surface 100b. In the light-emitting device 100, the lower surface 100a includes a lower surface 18Aa of the wiring structure 18A, and the upper surface 100b includes the upper surface 30Ab of the wavelength conversion layer 30A. The lateral surfaces 100c of the light-emitting device 100 each include the lateral surface 20Ac of the substrate 20A and the lateral surface 30Ac of the wavelength conversion layer 30A.

A light-emitting module 200 including the light-emitting device 100 in the present embodiment will be described below.

FIG. 6A is a schematic plan view of the light-emitting module in the present embodiment. FIG. 6B is a schematic cross-sectional view of the light-emitting module in the present embodiment. FIG. 6B is a schematic cross-sectional view taken along the line VIB-VIB of FIG. 6A.

As shown in FIG. 6A and FIG. 6B, the light-emitting module 200 includes the light-emitting device 100, a light-reflective member 50, a supporting member 40, and a plurality of electrically conductive members 60. A plurality of metal members 70 are disposed on the supporting member 40. There is electrical continuity between the light-emitting device 100 mounted and the metal members 70 on the supporting member 40 through the electrically conductive members 60. The electrically conductive members 60 are electrically connected to a first electrically conductive layer 14A and a second electrically conductive layer 15A of the light-emitting device 100. The light-reflective member 50 covers the light-emitting device 100, the supporting member 40, and the electrically conductive members 60. The light-reflective member 50 is disposed such that the upper surface 30Ab of the wavelength conversion layer 30A, which serves as the main light extracting surface of the light-emitting module 200, is exposed. The light-reflective member 50 is, for example, a member containing a light-diffusing material in a base material. For example, resin or glass is used for the base material. For example, titanium oxide or aluminum oxide is used for the light-diffusing material.

In the method of manufacturing the light-emitting device 100 according to the present embodiment, the crack C is formed in the substrate 20 provided with the semiconductor structure 10 before the wavelength conversion layer 30 is disposed. After that, the first portion P1 of the wavelength conversion layer 30 disposed on the substrate 20, the first portion P1 overlapping with the crack C, is removed to form the first recess R1 and leave the second portion P2 of the wavelength conversion layer 30 located between the first recess R1 and the semiconductor structure 10. The second portion P2 overlapping with the crack C is then cleaved with the crack C being the starting point to perform singulation into a plurality of light-emitting devices 100. This allows for reducing chipping of the substrate 20, which is likely to be caused, for example, in the case in which the substrate 20 and the wavelength conversion layer 30 are cut using the blade B1, so that yield can be improved. Further, cleaving is performed with the crack C formed by the laser beam L being the starting point, which allows the light-emitting device 100 to have the lateral surfaces 100c in good condition, so that yield in the cleaving step is improved.

In the present embodiment, the first portion P1 of the wavelength conversion layer 30 is removed using the blade B1, and the second portion P2 is left. As a result, in the light-emitting device 100, the upper surface 30Ab of the wavelength conversion layer 30A has an area smaller than the area of the lower surface 30Aa, so that the luminance of the light-emitting device 100 can be enhanced. For example, in the case in which the wavelength conversion layer 30 and the substrate 20 are cut with the blade B1, the lateral surfaces 100c of the light-emitting device 100 become flat surfaces including no curved surfaces, and the areas of the upper surface 30Ab and the lower surface 30Aa of the wavelength conversion layer 30A become substantially the same, which may fail to enhance the luminance.

First Modification of First Embodiment

In a method of manufacturing a light-emitting device 101 in the present modification, a portion of the semiconductor structure 10 directly below the region in which the crack C is to be formed and the vicinity of the portion are removed before the step of forming the crack C. The region in which the crack C is to be formed and the vicinity of the region are thus exposed on the first surface 20a of the substrate 20.

Figure 7:
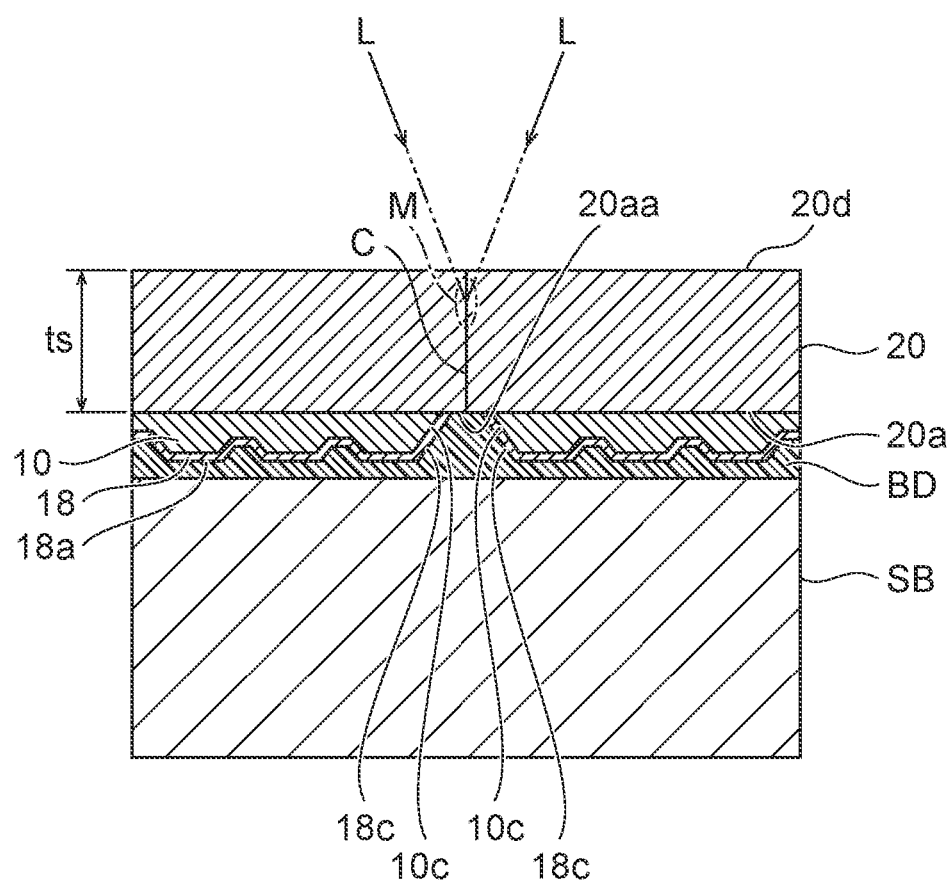
FIG. 7 is a schematic cross-sectional view illustrating a method of manufacturing a light-emitting device of a first modification of the first embodiment.

FIG. 7 is a schematic cross-sectional view illustrating the method of manufacturing a light-emitting device of the present modification, specifically a schematic cross-sectional view illustrating the step of forming the crack C in the substrate 20.

Figure 8:
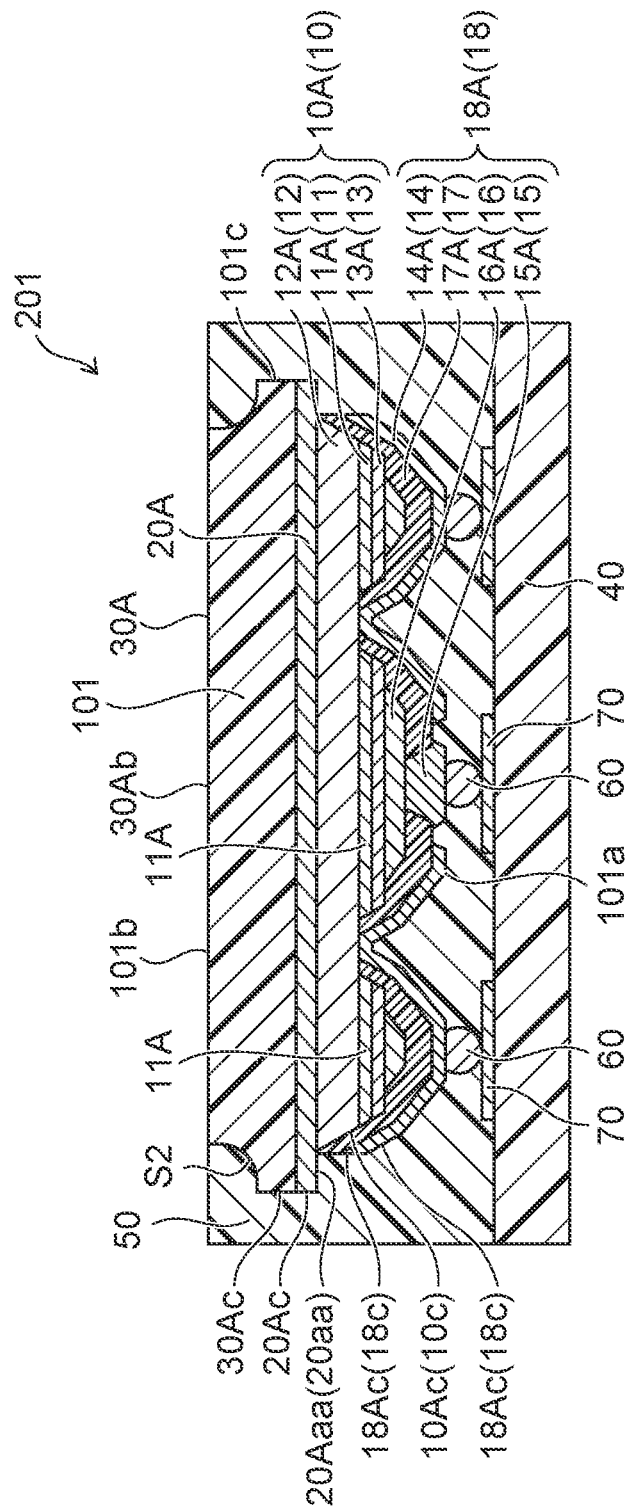
FIG. 8 is a schematic cross-sectional view of a light-emitting module in the first modification of the first embodiment.

FIG. 8 is a schematic cross-sectional view of a light-emitting module in the present modification.

Generally, only differences from the first embodiment will be described below. Matters other than the matters described below are substantially the same as in the first embodiment.

As shown in FIG. 7, in the step of forming the wiring structure 18, a portion of the semiconductor structure 10 directly below the region in which the crack C is to be formed and the vicinity of the portion are first removed when a portion on the lower surface side of the semiconductor structure 10 is removed. An exposed surface 20aa is provided in the region of the first surface 20a of the substrate 20 in which the crack C is to be formed and the vicinity of the region. The width of the exposed surface 20aa is, for example, 20 μm or more and 120 μm or less.

Removal of the semiconductor structure 10 allows a lateral surface 10c of the semiconductor structure 10 to be an inclined surface toward the upper side, the inclined surface being close to the region in which the crack C is to be formed. With the inclined lateral surface 10c of the semiconductor structure 10, light emitted from the light-emitting layer 11 can be easily reflected toward the wavelength conversion layer 30.

Subsequently, the wiring structure 18 is formed below the semiconductor structure 10.

A lateral surface 18c of the wiring structure 18 is located on the lateral surface 10c of the semiconductor structure 10. As shown in FIG. 8, the first electrically conductive layer 14 constituting a portion of the lateral surface 18c is formed parallel to the lateral surface 10c of the semiconductor structure 10 to cover the lateral surface of the light-emitting layer 11.

The wiring structure 18 is not disposed on the exposed surface 20aa. The wiring structure 18 may be partially disposed on a portion of the exposed surface 20aa.

In the step of bonding the supporting substrate SB, the bonding member BD may adhere to the exposed surface 20aa. The exposed surface 20aa faces the upper surface of the supporting substrate SB across the bonding member BD.

In the step of forming the crack C, the crack C formed inside the substrate 20 reaches the exposed surface 20aa. The crack C is located substantially at the center of the exposed surface 20aa.

In the step of cleaving the second portion P2 of the wavelength conversion layer 30 along the crack C, the exposed surface 20aa provided on the first surface 20a of the substrate 20 prevents the semiconductor structure 10 and the wiring structure 18 from being cleaved along the crack C and allows only the substrate 20 and the second portion P2 of the wavelength conversion layer 30 to be cleaved along the crack C.

The light-emitting device 101 manufactured by the manufacturing method of the present modification and a light-emitting module 201 will be described below.

As shown in FIG. 8, a lateral surface 101c of the light-emitting device 101 includes a mark of the crack C in the substrate 20, an inner surface of the first recess R1 and a cleaved surface of the second portion P2 in the wavelength conversion layer 30, the lateral surface 18c, which is not a cleaved surface, of the wiring structure 18, and a cleaved surface of the substrate 20.

The semiconductor structure 10A is located directly below the upper surface 30Ab of the wavelength conversion layer 30A. An exposed surface 20Aaa of the substrate 20A is located directly below the second surface S2 of the wavelength conversion layer 30A.

As shown in FIG. 8, in the light-emitting module 201 including the light-emitting device 101 of the present modification, the exposed surface 20Aaa of the substrate 20A is preferably in contact with the light-reflective member 50. Lateral surfaces 10Ac of the semiconductor structure 10A are covered with the light-reflective member 50. The lateral surfaces 20Ac of the substrate 20A and the lateral surfaces 30Ac of the wavelength conversion layer 30A are covered with the light-reflective member 50.

In the method of manufacturing the light-emitting device 101 of the present modification, the portion of the semiconductor structure 10 directly below the region in which the crack C is to be formed and the vicinity of the portion are removed before the crack C is formed to provide the exposed surface 20aa of the first surface 20a of the substrate 20 on which the region in which the crack C is to be formed and the vicinity of the region are exposed. The lateral surface 10c of the semiconductor structure 10 is inclined, and the light-reflective member 50 is disposed to cover the lateral surface 10Ac in the light-emitting module 201. This allows for enhancing the light extraction efficiency of the light-emitting module 201 including the light-emitting device 101 in the present modification.

Second Embodiment

A method of manufacturing a light-emitting device 102 according to a second embodiment will be described below.

The method of manufacturing a light-emitting device 102 according to the present embodiment further includes, between the step of leaving the second portion P2 and the step of cleaving the second portion P2, a step of forming a second recess R2 by removing a third portion P3 of the second portion P2 and a step of leaving a fourth portion P4.

Figure 9A:
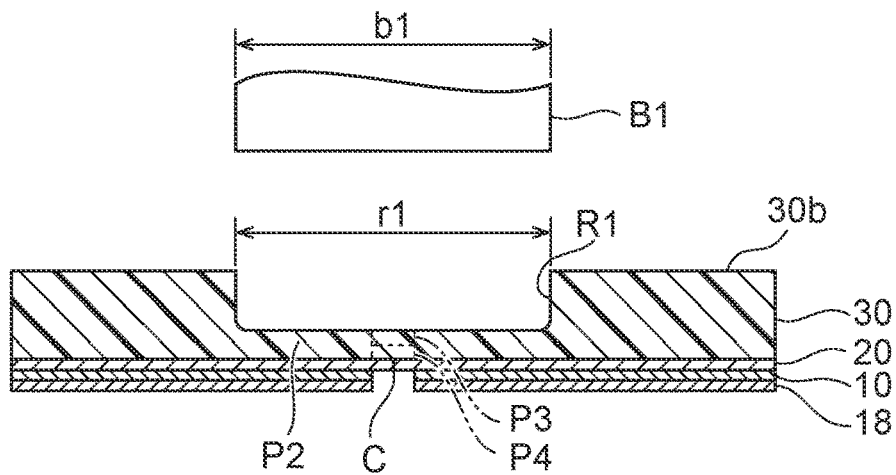
FIG. 9A is a schematic cross-sectional view illustrating a method of manufacturing a light-emitting device according to a second embodiment.
Figure 9B:
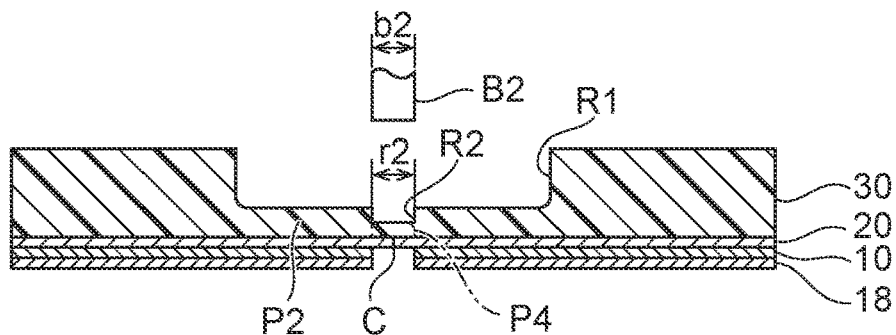
FIG. 9B is a schematic cross-sectional view illustrating the method of manufacturing a light-emitting device according to the second embodiment.
Figure 9C:
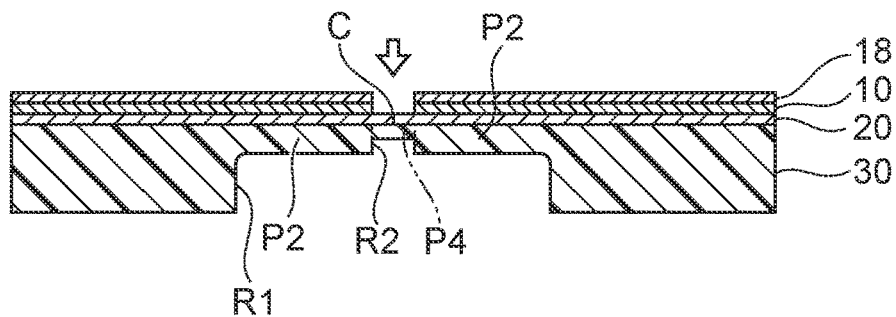
FIG. 9C is a schematic cross-sectional view illustrating the method of manufacturing a light-emitting device according to the second embodiment.

FIG. 9A to FIG. 9C are schematic cross-sectional views illustrating the method of manufacturing a light-emitting device according to the present embodiment.

Generally, only differences from the first embodiment will be described below. Matters other than the matters described below are substantially the same as in the first embodiment.

As shown in FIG. 9A, the semiconductor structure 10 and the wiring structure 18 are not formed directly below the crack C in the present embodiment.

Forming First Recess R1 and Leaving Second Portion P2

The first portion P1 of the wavelength conversion layer 30 is removed as shown in FIG. 9A. This defines the first recess R1 in the wavelength conversion layer 30, while the second portion P2 is left. In the present embodiment, the width b1 of the blade B1 is, for example, 300 µm or more and 500 µm or less, and the width r1 of the first recess R1 is, for example, 300 µm or more and 500 µm or less. This allows for further reducing the area of the upper surface 30Ab of the wavelength conversion layer 30A of the light-emitting device 102 compared with the first embodiment, so that the luminance of the light-emitting device 100 can be further enhanced. The thickness of the wavelength conversion layer 30 removed when the first recess R1 is formed is preferably, for example, in a range of 50% or more and 90% or less, more preferably 70% or more and 90% or less, of the thickness of the wavelength conversion layer 30. The thickness of the second portion P2 is preferably, for example, in a range of 10% or more and 50% or less, more preferably 10% or more and 30% or less, of the thickness of the wavelength conversion layer 30.

Forming Second Recess R2 and Leaving Fourth Portion P4

As shown in FIG. 9B, the third portion P3 of the second portion P2 is removed. This defines the second recess R2 in the second portion P2, while the fourth portion P4 is left. The third portion P3 overlaps with the crack C in the second portion P2 when viewed in the direction from the wavelength conversion layer 30 toward the semiconductor structure 10. An imaginary line that continuous from the crack C is located substantially at the center of the third portion P3 in a cross-sectional view as shown in FIG. 9B. The third portion P3 is located substantially at the center of the second portion P2 in a top view. The third portion P3 is a portion of the second portion P2 away from the substrate 20.

The fourth portion P4 is located between the second recess R2 and the substrate 20. The fourth portion P4 is located directly below and adjacent to the third portion P3. The fourth portion P4 is also located directly above the crack C in a top view, and the crack C is located substantially at the center of the fourth portion P4. The fourth portion P4 is located substantially at the center of the second portion P2 in a top view. The third portion P3 and the fourth portion P4 each have a thickness smaller than a thickness of the second portion P2. The thickness of the third portion P3 is, for example, in a range of 10% or more and 50% or less of the thickness of the second portion P2. When the thickness of the third portion P3 is 10% or more of the thickness of the second portion P2, the wavelength conversion layer 30 is easily cleaved in the second recess R2 in the cleaving step, so that yield in the cleaving step is improved. When the thickness of the third portion P3 is 50% or less of the thickness of the second portion P2, a blade B2 is inhibited from reaching the substrate 20.

By removing the third portion P3 in a processing region RT shown in FIG. 1 in a plan view, the second recess R2 is formed, and the fourth portion P4 is left. The third portion P3 is removed along the intended singulation line DT in a plan view.

The third portion P3 is removed by, for example, cutting with the blade B2 having a width smaller than the blade B1. A width b2 of the blade B2 is, for example, about 30 µm. A width r2 of the second recess R2 formed by removal of the third portion P3 is, for example, 10 µm or more and 50 µm or less. The width r2 of the second recess R2 formed by removal of the third portion P3 may be slightly greater than the width b2 of the blade B2. The thickness of the wavelength conversion layer 30 removed when the second recess R2 is formed is smaller than the thickness of the wavelength conversion layer 30 removed when the first recess R1 is formed. In order to leave the fourth portion P4 between the third portion P3 and the substrate 20, cutting with the blade B2 is performed such that the blade B2 does not reach the substrate 20.

The first portion P1 of the wavelength conversion layer 30 is removed with the blade B1 to leave the second portion P2, and the third portion P3 of the second portion P2 is removed with the blade B2 having a width smaller of the blade B1 to leave the fourth portion P4. This allows the area of the upper surface 30Ab of the wavelength conversion layer 30A to be even smaller than the area of the lower surface 30Aa in the light-emitting device 100 to be obtained after cleaving described below, so that the luminance of the light-emitting device 100 can be further enhanced. For example, in the case in which cleaving is performed using the first recess R1 formed with a blade having a comparatively large width without forming the second recess R2, it is difficult to control the position of cleaving, which may decrease yield. In the present embodiment, the fourth portion P4 is located substantially at the center of the second portion P2 and has a thickness smaller than a thickness of the second portion P2. This allows for easily performing cleaving in the fourth portion P4, and facilitating control of the cleaving position, so that yield in the cleaving step is improved.

The wavelength conversion layer 30 is partially removed with the blade B2 having the width different from the width of the blade B1 in the present embodiment, but this is not limiting. For example, the third portion P3 may be removed by means other than a blade as long as the widths of the wavelength conversion layer 30 to be removed are different from each other. For example, the third portion P3 may be removed by irradiation with a laser beam.

Cleaving

Subsequently, the fourth portion P4 of the wavelength conversion layer 30 is cleaved along the crack C.

As shown in FIG. 9C, for example, a portion of the substrate 20 located directly below the second recess R2 is pressed from the lower side. With this operation, the substrate 20 is cleaved using the crack C, and the fourth portion P4 of the wavelength conversion layer 30 is also cleaved. The fourth portion P4 has a thickness smaller than a thickness of the second portion P2 and overlaps with the crack C in a top view, which easily cleaves the fourth portion P4 along the crack C. Further, the fourth portion P4 is located substantially at the center of the second portion P2, and the substantial center of the fourth portion P4 is located on the imaginary line that continues from the crack C, so that the fourth portion P4 is easily cleaved along the crack C. Yield in the cleaving step can also be improved.

Figure 10:
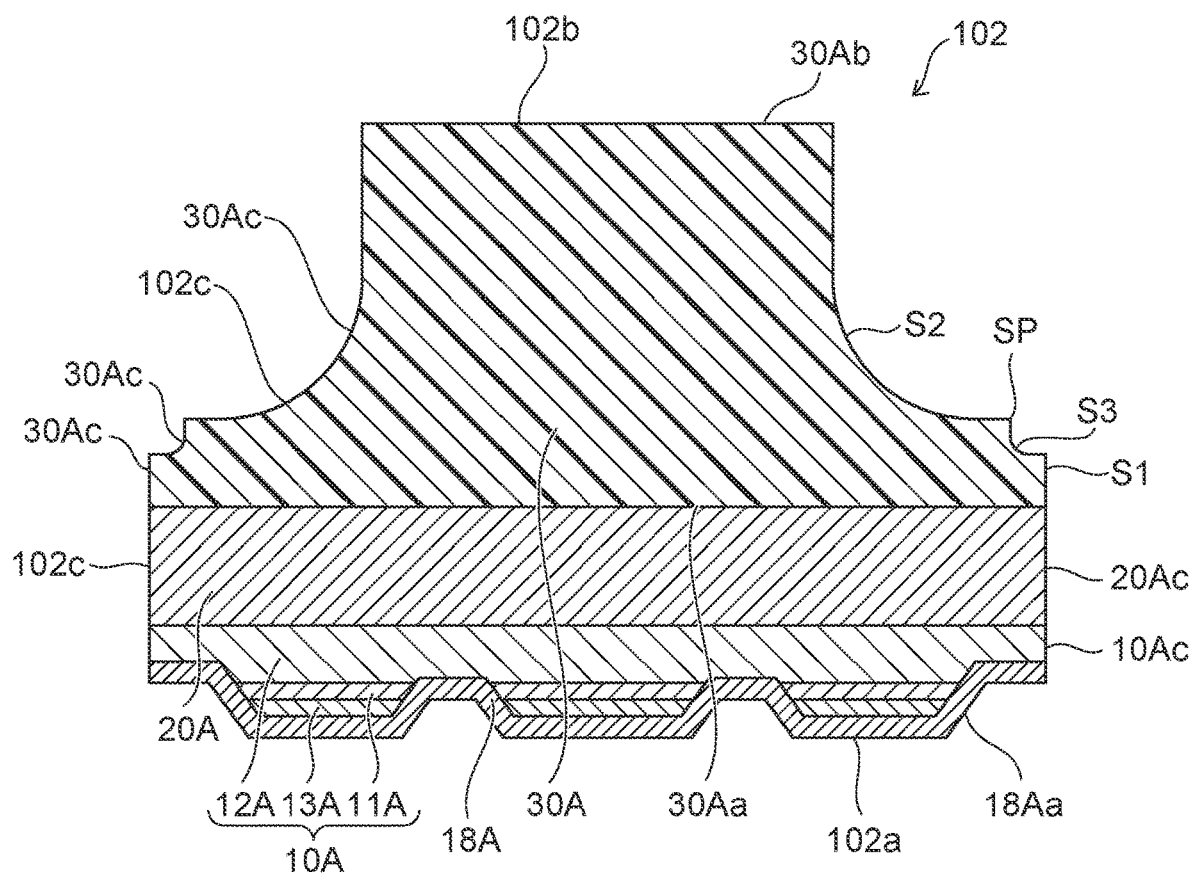
FIG. 10 is a schematic cross-sectional view of the light-emitting device in the second embodiment.

As shown in FIG. 10, a lateral surface 102c of the light-emitting device 102 manufactured as described above includes a mark of the crack C in the substrate 20, inner surfaces of the first recess R1 and the second recess R2 and a cleaved surface of the fourth portion P4 in the wavelength conversion layer 30, and a cleaved surface of the substrate 20.

The light-emitting device 102 manufactured by the manufacturing method according to the present embodiment will be described below.

FIG. 10 is a schematic cross-sectional view of the light-emitting device in the present embodiment.

As shown in FIG. 10, the wavelength conversion layer 30A included in the light-emitting device 102 has the upper surface 30Ab that is smaller in area than the lower surface 30Aa. The upper surface 30Ab of the wavelength conversion layer 30A in the present embodiment can be smaller in area than the upper surface 30Ab of the wavelength conversion layer 30A in the first embodiment. The lateral surfaces 30Ac of the wavelength conversion layer 30 each have the first surface S1, the second surface S2, and a third surface S3. The third surface S3 is located between the first surface S1 and the second surface S2 to connect the first surface S1 and the second surface S2. The third surface S3 is located on the lower surface 30Aa side of the second surface S2 in the lateral surface 30Ac of the wavelength conversion layer 30A. The third surface S3 is a cut surface formed by cutting with the blade B2. The third surface S3 includes a curved surface. A projection SP is formed at the boundary between the second surface S2 and the third surface S3.

In the method of manufacturing the light-emitting device 102 according to the present embodiment, in the second portion P2 of the wavelength conversion layer 30, the third portion P3 overlapping with the crack C is removed to form the second recess R2 and leave the fourth portion P4 of the wavelength conversion layer 30 located between the second recess R2 and the substrate 20. The fourth portion P4 overlapping with the crack C is then cleaved with the crack C being the starting point to perform singulation into a plurality of light-emitting devices 102. This improves precision in the cleaving position, which allows the light-emitting device 102 to have the lateral surface 102c in a good shape, so that yield in the cleaving step is improved.

In the present embodiment, the wavelength conversion layer 30 is processed through two steps in which the widths of the wavelength conversion layer 30 to be removed are different. The first recess R1 with a comparatively large width is first formed in the first portion P1, and the second recess R2 with a width smaller than the first recess R1 is then formed on the fourth portion P4 above the crack C in the second portion P2. This allows for improving yield in the cleaving step while the luminance of the light-emitting device 102 is further enhanced by reducing the area of the upper surface 30Ab of the wavelength conversion layer 30A, which serves as the emission surface of the light-emitting device 102.

Third Embodiment

A method of manufacturing a light-emitting device 103 according to a third embodiment will be described below.

The present embodiment includes steps after the cleaving step, and the product of cleaving is not referred to as the light-emitting device 103 but as an intermediate structure 103M.

The method of manufacturing the light-emitting device 103 according to the present embodiment further includes, after the cleaving step, increasing a distance between adjacent intermediate structures 103M, forming a light-transmissive layer 80 on a surface of each intermediate structure 103M, and partially removing the light-transmissive layer 80.

FIG. 11A to FIG. 12B are schematic cross-sectional views illustrating the method of manufacturing a light-emitting device according to the present embodiment.

Generally, only differences from the first embodiment will be described below. Matters other than the matters described below are substantially the same as in the first embodiment.

Cleaving

Figure 11A:
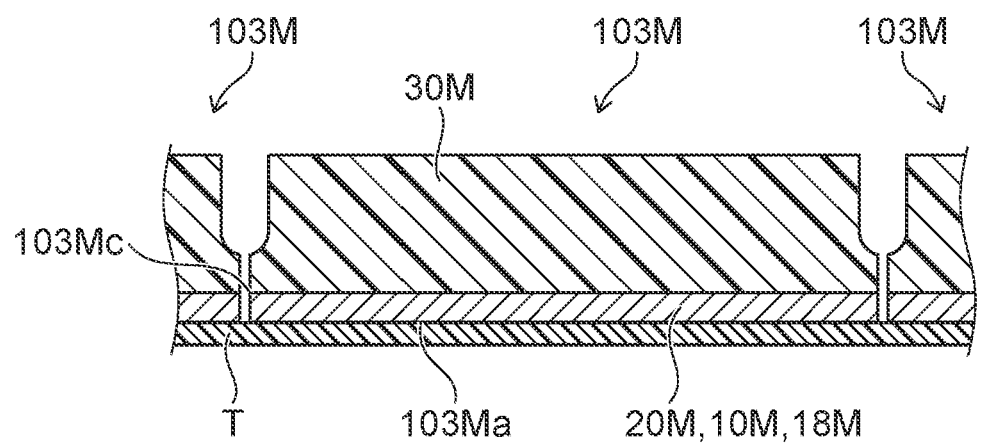
FIG. 11A is a schematic cross-sectional view illustrating a method of manufacturing a light-emitting device according to a third embodiment.

As shown in FIG. 4A, the second portion P2 of the wavelength conversion layer 30 is cleaved along the crack. As shown in FIG. 11A, the intermediate structures 103M are formed by cleaving with lower surfaces 103Ma being fixed to the tape material T. Lower lateral surfaces 103Mc of adjacent intermediate structures 103M are in contact with each other or face each other a short distance away from each other.

Each intermediate structure 103M includes a semiconductor structure 10M that is a portion of the semiconductor structure 10, a wiring structure 18M that is a portion of the wiring structure 18, a substrate 20M that is a portion of the substrate 20, and a wavelength conversion layer 30M that is a portion of the wavelength conversion layer 30 as shown in FIG. 11A. For the sake of simplicity, the substrate 20M, the semiconductor structure 10M, and the wiring structure 18M are depicted as one body in FIG. 11A to FIG. 12B.

Increasing Distance Between Adjacent Intermediate Structures

Figure 11B:
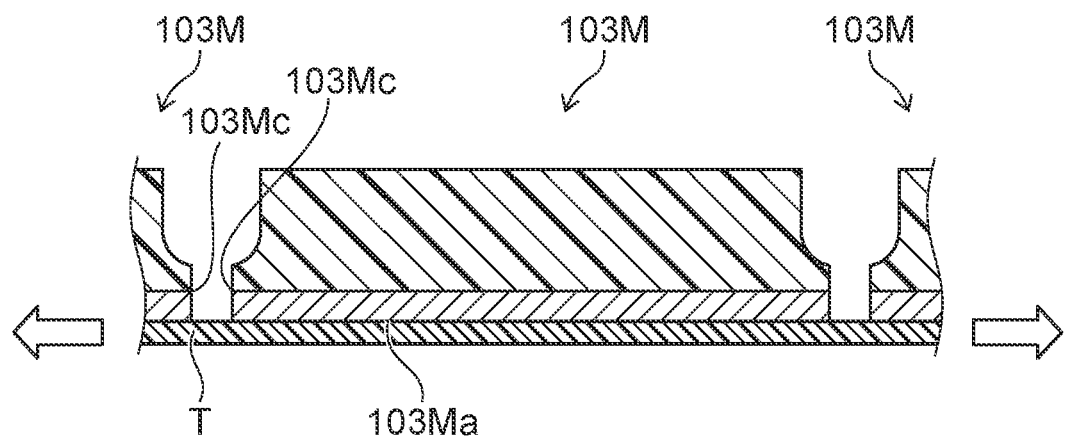
FIG. 11B is a schematic cross-sectional view illustrating the method of manufacturing a light-emitting device according to the third embodiment.

Subsequently, the distance between adjacent intermediate structures 103M is increased by stretching the tape material T as shown in FIG. 11B.

The distance between adjacent intermediate structures 103M is, for example, the distance between the lower lateral surfaces 103Mc facing each other. The distance between adjacent intermediate structures 103M can be, for example, in a range of 10 μm or more and 50 μm or less. This allows the lower lateral surfaces 103Mc to be processed even on the tape material T. With the increased distance between adjacent intermediate structures 103M, the surfaces of the intermediate structures 103M are easily processed.

In the present embodiment, the tape material T preferably has such adhesion as not to be detached from the lower surfaces 103Ma of the intermediate structures 103M when being stretched.

Subsequently, the surfaces of each intermediate structure 103M are processed.

The step of processing the surfaces of the intermediate structure 103M includes, for example, forming the light-transmissive layer 80 on the surfaces of the intermediate structure 103M and partially removing the light-transmissive layer 80.

Forming Light-Transmissive Layer 80 on Surfaces of Intermediate Structure 103M

Figure 12A:
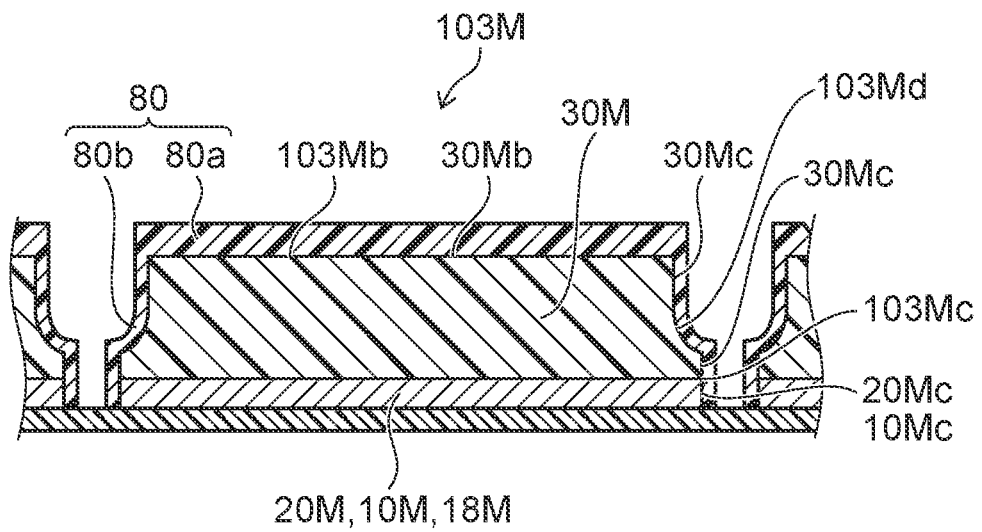
FIG. 12A is a schematic cross-sectional view illustrating the method of manufacturing a light-emitting device according to the third embodiment.

The light-transmissive layer 80 is formed on the surfaces of the intermediate structure 103M as shown in FIG. 12A.

For example, silicon oxide (SiO$_2$) can be used for the light-transmissive layer 80. The light-transmissive layer 80 is formed by, for example, sputtering.

The light-transmissive layer 80 is disposed on, for example, the lower lateral surfaces 103Mc, upper lateral surfaces 103Md, and an upper surface 103Mb of the intermediate structure 103M. Specifically, for example, the light-transmissive layer 80 is disposed on the surfaces of the wavelength conversion layer 30M, lateral surfaces 20Mc of the substrate 20M, and lateral surfaces 10Mc of the semiconductor structure 10M.

The light-transmissive layer 80 includes a first layer 80$a$ disposed on an upper surface 30Mb of the wavelength conversion layer 30M and a second layer 80$b$ disposed on lateral surfaces 30Mc of the wavelength conversion layer 30M and the lateral surfaces 20Mc of the substrate 20M.

The first layer 80$a$ has the thickness greater than the thickness of the second layer 80$b$. The thickness of the first layer 80$a$ can be, for example, in a range of 1 μm or more and 2 μm or less. The thickness of the second layer 80$b$ can be, for example, in a range of 200 nm or more and 500 nm or less.

The first layer 80$a$ is formed on the upper surface by sputtering and therefore tends to have the quality denser than the quality of the second layer 80$b$ formed on the lateral surfaces. Accordingly, the first layer 80$a$ can be precisely etched. For example, it is easy to etch the first layer 80$a$ by patterning using a mask to form a desired shape.

Partially Removing Light-transmissive Layer 80

Figure 12B:
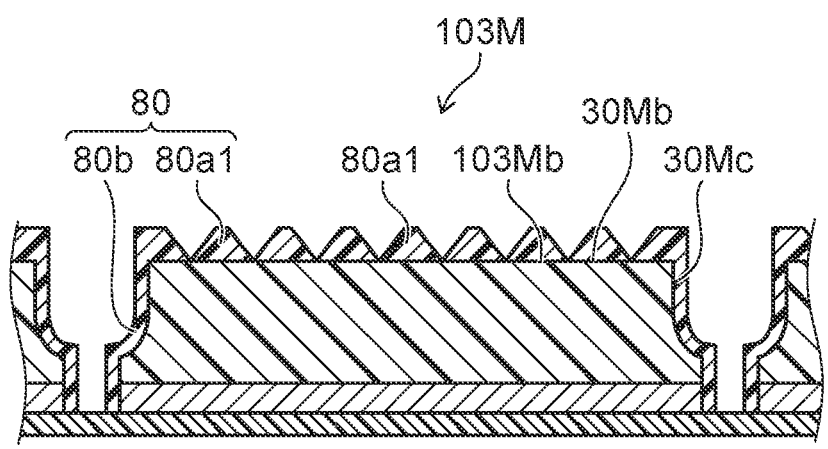
FIG. 12B is a schematic cross-sectional view illustrating the method of manufacturing a light-emitting device according to the third embodiment.

The light-transmissive layer 80 is partially removed as shown in FIG. 12B.

For example, a mask covering the second layer 80$b$ and partially covering the first layer 80$a$ is formed, and the first layer 80$a$ is partially removed by removing the first layer 80$a$ through the mask. The light-transmissive layer 80 is removed by, for example, wet etching or dry etching. For example, a plurality of first layer portions 80$a$1 arranged in an array are disposed on the upper surface 30Mb of the wavelength conversion layer 30M by patterning the mask.

For example, the first layer portions 80$a$1 each have a trapezoidal shape in a cross-sectional view as shown in FIG. 12B but may have a triangular shape. For example, the first layer portions 80$a$1 each have a circular or quadrangular shape in a top view. A plurality of light-emitting devices 103 are manufactured through the above steps.

The light-emitting device 103 manufactured by the manufacturing method according to the present embodiment will be described below.

Figure 13:
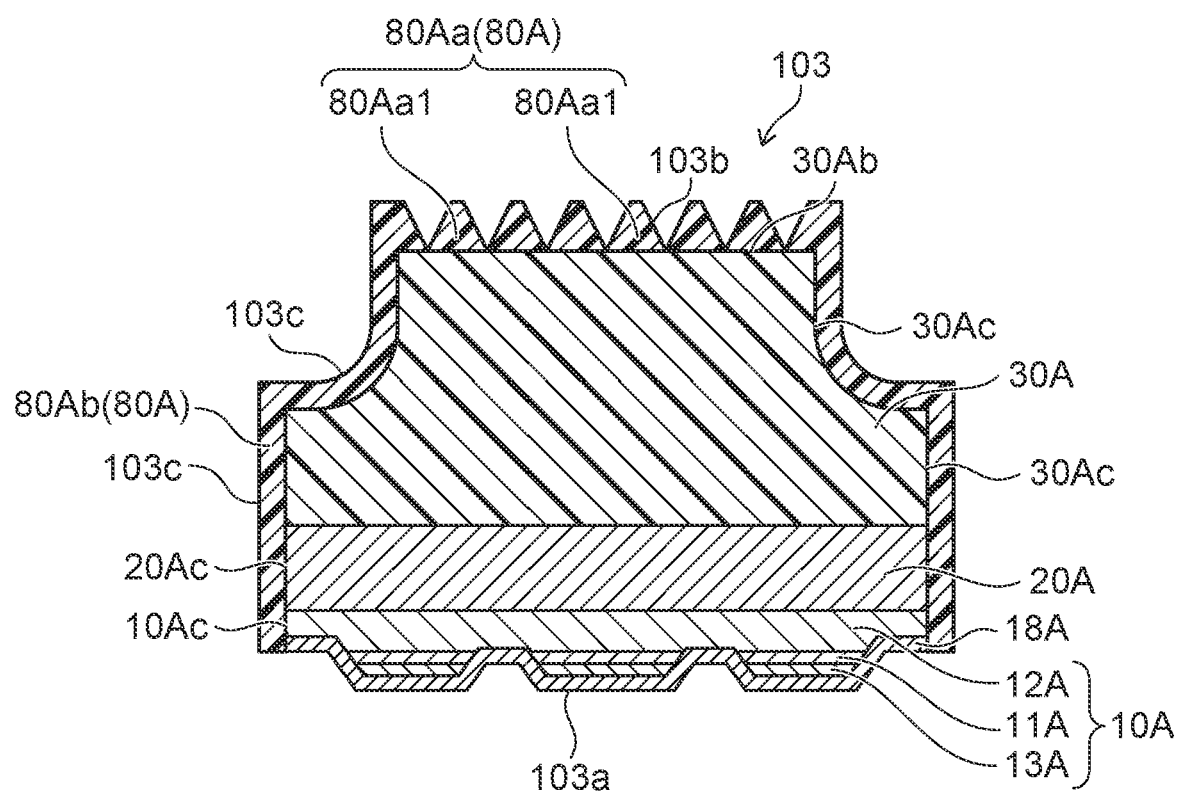
FIG. 13 is a schematic cross-sectional view of the light-emitting device in the third embodiment.

FIG. 13 is a schematic cross-sectional view of the light-emitting device in the present embodiment.

The light-emitting device 103 includes the semiconductor structure 10A that is a portion of the semiconductor structure 10, the wiring structure 18A that is a portion of the wiring structure 18, the substrate 20A that is a portion of the substrate 20, the wavelength conversion layer 30A that is a portion of the wavelength conversion layer 30, and a light-transmissive layer 80A.

The light-transmissive layer 80A is exposed on an upper surface 103$b$ and lateral surfaces 103$c$ of the light-emitting device 103.

The light-transmissive layer 80A includes a first layer 80Aa and a second layer 80Ab. The first layer 80Aa is disposed on the upper surface 30Ab of the wavelength conversion layer 30A. The second layer 80Ab is disposed on the lateral surfaces 30Ac of the wavelength conversion layer 30A, the lateral surfaces 20Ac of the substrate 20A, and the lateral surfaces 10Ac of the semiconductor structure 10A. The first layer 80Aa has the thickness greater than the thickness of the second layer 80Ab. The quality of the first layer 80Aa is denser than the quality of the second layer 80Ab. The quality of the second layer 80Ab is coarser than the quality of the first layer 80Aa. The refractive index of the second layer 80Ab is lower than the refractive index of the first layer 80Aa.

The first layer 80Aa includes a plurality of first layer portions 80Aa1 arranged in an array on the upper surface 30Ab of the wavelength conversion layer 30A. For example, the first layer portions 80Aa1 each have a trapezoidal shape in a cross-sectional view as shown in FIG. 13 but may have a triangular shape. For example, the first layer portions 80Aa1 each have a circular or quadrangular shape in a top view.

By the method of manufacturing the light-emitting device 103 according to the present embodiment, many intermediate structures 103M can be manufactured from the single substrate 20, and the surfaces of the intermediate structure 103M can be efficiently processed.

The light-emitting device 103 in the present embodiment includes the second layer 80Ab of the light-transmissive layer 80A disposed on the lateral surfaces 30Ac of the wavelength conversion layer 30A, so that light traveling toward the lateral sides of the light-emitting device 103 can be reflected at the interfaces between the lateral surfaces 30Ac of the wavelength conversion layer 30A and the second layer 80Ab, which enhances the light extraction efficiency from the upper surface 103$b$ of the light-emitting device 103. Further, with the first layer portions 80Aa1 formed on the upper surface 30Ab of the wavelength conversion layer 30 in the light-emitting device 103, the light extraction efficiency from the upper surface 103$b$ of the light-emitting device 103 can be enhanced.

What is claimed is:

1. A method of manufacturing a light-emitting device, the method comprising:
    providing a substrate having a first surface and a second surface opposite to the first surface;
    forming, on or above the first surface of the substrate, a semiconductor structure comprising a light-emitting layer;
    forming a crack inside the substrate, the crack reaching the first surface of the substrate;
    disposing a wavelength conversion layer on the second surface of the substrate;
    forming a first recess in the wavelength conversion layer by removing a first portion of the wavelength conversion layer, the first portion overlapping with the crack when viewed in a direction from the wavelength conversion layer toward the semiconductor structure, and leaving a second portion of the wavelength conversion layer between the first recess and the semiconductor structure; and
    cleaving the second portion along the crack.

2. The method of manufacturing a light-emitting device according to claim 1, wherein, the step of forming the crack comprises forming a modified region inside the substrate by applying a laser beam to the substrate from the second surface of the substrate such that the crack develops from the modified region toward the first surface.

3. The method of manufacturing a light-emitting device according to claim 2, wherein, in the step of forming the crack, the modified region is formed by condensing the laser beam at a position half or more of a thickness of the substrate away from the first surface.

4. The method of manufacturing a light-emitting device according to claim 2, further comprising:
   between the step of forming the first recess and the step of cleaving the second portion, forming a second recess in the wavelength conversion layer by removing a third portion of the second portion, the third portion overlapping with the crack when viewed in the direction from the wavelength conversion layer toward the semiconductor structure, and leaving a fourth portion of the second portion between the second recess and the semiconductor structure; and
   cleaving the fourth portion along the crack.

5. The method of manufacturing a light-emitting device according to claim 1, wherein in the step of forming the first recess, the first portion is removed by cutting with a blade.

6. The method of manufacturing a light-emitting device according to claim 1, further comprising:
   between the step of forming the first recess and the step of cleaving the second portion, forming a second recess in the wavelength conversion layer by removing a third portion of the second portion, the third portion overlapping with the crack when viewed in the direction from the wavelength conversion layer toward the semiconductor structure, and leaving a fourth portion of the second portion between the second recess and the semiconductor structure; and
   cleaving the fourth portion along the crack.

7. The method of manufacturing a light-emitting device according to claim 1, further comprising:
   after the step of forming the semiconductor structure, bonding a supporting substrate on a side opposite to a substrate side of the semiconductor structure; and
   after the step of disposing the wavelength conversion layer, removing the supporting substrate.

8. The method of manufacturing a light-emitting device according to claim 1, further comprising fixing a tape material to a side opposite to a substrate side of the semiconductor structure.

9. The method of manufacturing a light-emitting device according to claim 8, wherein:
   in the step of cleaving the second portion, a plurality of intermediate structures each comprising a portion of the semiconductor structure, a portion of the substrate, and a portion of the wavelength conversion layer are formed with the intermediate structures being fixed to the tape material,
   the method further comprises, after the step of cleaving the second portion:
      increasing a distance between adjacent ones of the intermediate structures by stretching the tape material; and
      forming a light-transmissive layer on a surface of each of the intermediate structures.

10. The method of manufacturing a light-emitting device according to claim 9, wherein:
   the light-transmissive layer comprises a first layer on an upper surface of each of the intermediate structures, and a second layer on a lateral surface of each of the intermediate structures; and
   a thickness of the first layer is greater than a thickness of the second layer.

11. The method of manufacturing a light-emitting device according to claim 9, further comprising, after the step of forming the light-transmissive layer, partially removing the light-transmissive layer.

12. The method of manufacturing a light-emitting device according to claim 11, wherein:
   the light-transmissive layer comprises a first layer on an upper surface of each of the intermediate structures, and a second layer on a lateral surface of each of the intermediate structures, and
   in the step of partially removing the light-transmissive layer, the first layer is partially removed to arrange a plurality of first layer portions in an array.

13. A method of manufacturing a light-emitting device, the method comprising:
   providing a substrate having a first surface and a second surface opposite to the first surface;
   forming, on or above the first surface of the substrate, a semiconductor structure comprising a light-emitting layer;
   forming a crack inside the substrate, the crack reaching the first surface of the substrate;
   after the step of forming the crack, forming a third surface of the substrate by removing a portion of the substrate from the second surface side of the substrate;
   disposing a wavelength conversion layer on or above the third surface of the substrate;
   forming a first recess in the wavelength conversion layer by removing a first portion of the wavelength conversion layer, the first portion overlapping with the crack when viewed in a direction from the wavelength conversion layer toward the semiconductor structure, and leaving a second portion of the wavelength conversion layer between the first recess and the semiconductor structure; and
   cleaving the second portion along the crack.

14. The method of manufacturing a light-emitting device according to claim 13, wherein, the step of forming the crack comprises forming a modified region inside the substrate by applying a laser beam to the substrate from the second surface of the substrate such that the crack develops from the modified region.

15. The method of manufacturing a light-emitting device according to claim 14, wherein, in the step of forming the crack, the crack develops from the modified region toward the first surface.

16. The method of manufacturing a light-emitting device according to claim 15, wherein, in the step of forming the crack, the modified region is formed by condensing the laser beam at a position half or more of a thickness of the substrate away from the first surface.

17. The method of manufacturing a light-emitting device according to claim 15, wherein, in the step of forming the third surface, the modified region is removed from the substrate, and the crack remains in the substrate.

18. The method of manufacturing a light-emitting device according to claim 14, wherein, in the step of forming the crack, the modified region is formed by condensing the laser beam at a position half or more of a thickness of the substrate away from the first surface.

19. The method of manufacturing a light-emitting device according to claim 14, wherein, in the step of forming the third surface, the modified region is removed from the substrate, and the crack remains in the substrate.

20. The method of manufacturing a light-emitting device according to claim 13, wherein, after disposing the wavelength conversion layer, a thickness of the substrate is smaller than a thickness of the wavelength conversion layer.

* * * * *